United States Patent
Joo et al.

(10) Patent No.: US 9,888,598 B2
(45) Date of Patent: Feb. 6, 2018

(54) CONNECTOR APPARATUS AND DISPLAY APPARATUS HAVING THE SAME

(71) Applicant: SAMSUNG ELECTRONICS CO., LTD., Suwon-si (KR)

(72) Inventors: Sung-yong Joo, Hwaseong-si (KR); Jeong-il Kang, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/420,874

(22) Filed: Jan. 31, 2017

(65) Prior Publication Data

US 2017/0273202 A1 Sep. 21, 2017

(30) Foreign Application Priority Data

Mar. 21, 2016 (KR) ........................ 10-2016-0033507

(51) Int. Cl.

| H01R 11/00 | (2006.01) |
| H05K 5/02 | (2006.01) |
| H05K 5/00 | (2006.01) |
| H01R 24/28 | (2011.01) |
| H01R 13/6585 | (2011.01) |
| H01R 107/00 | (2006.01) |

(52) U.S. Cl.
CPC ....... H05K 5/0247 (2013.01); H01R 13/6585 (2013.01); H01R 24/28 (2013.01); H05K 5/0017 (2013.01); *H01R 2107/00* (2013.01)

(58) Field of Classification Search
CPC ....... H01R 31/06; H01R 11/00; H01R 25/003

USPC .................................................... 439/502, 98
See application file for complete search history.

(56) References Cited

U.S. PATENT DOCUMENTS

| 6,969,268 B2 | 11/2005 | Brunker et al. |
| 2007/0270028 A1* | 11/2007 | Huang ................. H01R 13/641 439/502 |
| 2010/0289530 A1* | 11/2010 | Nakajima .............. H04N 5/775 327/63 |
| 2013/0016493 A1* | 1/2013 | Cook .................... H01R 13/514 361/827 |
| 2014/0051281 A1* | 2/2014 | Kobayashi ........... H01R 31/005 439/502 |
| 2015/0340775 A1 | 11/2015 | Bartell |
| 2015/0357752 A1 | 12/2015 | Wu et al. |
| 2015/0357770 A1 | 12/2015 | Xing et al. |
| 2015/0357806 A1 | 12/2015 | Korcz et al. |
| 2015/0362686 A1 | 12/2015 | Wang et al. |
| 2015/0364846 A1 | 12/2015 | Chen et al. |
| 2015/0364853 A1 | 12/2015 | Thijssen et al. |

(Continued)

FOREIGN PATENT DOCUMENTS

| JP | 2004-63288 A | 2/2004 |
| JP | 2008-140586 A | 6/2008 |

(Continued)

*Primary Examiner* — Abdullah Riyami
*Assistant Examiner* — Thang Nguyen
(74) *Attorney, Agent, or Firm* — Sughrue Mion, PLLC

(57) ABSTRACT

A connector apparatus a display apparatus including the connector are provided. The connector apparatus includes: a pair of connectors configured to be coupled to apparatuses; and a cable connecting the pair of connectors, wherein each connector of the pair of connectors includes a signal line part including a plurality of signal pins and a power line part including first and second terminals.

8 Claims, 6 Drawing Sheets

(56) References Cited

U.S. PATENT DOCUMENTS

2015/0364860 A1    12/2015  Cheng
2016/0070300 A1*   3/2016   Carnevali .............. G06F 1/181
                                                    361/679.41
2016/0118758 A1*   4/2016   Cymerman ........... H01R 31/06
                                                    439/39

FOREIGN PATENT DOCUMENTS

JP    2008140586  A  *  6/2008  ............. H01R 12/26
KR    20-0266893  Y1     3/2002

* cited by examiner

CONNECTOR APPARATUS AND DISPLAY APPARATUS HAVING THE SAME

CROSS-REFERENCE TO RELATED APPLICATIONS

This application claims priority from Korean Patent Application No. 10-2016-0033507, filed on Mar. 21, 2016 in the Korean Intellectual Property Office, the disclosure of which is incorporated herein by reference in its entirety.

BACKGROUND

Field

Apparatus and methods consistent with exemplary embodiments relate to a connector apparatus and a display apparatus including the connector apparatus.

Description of the Related Art

In general, a display apparatus, such as television (TV), a monitor, and the like, may be physically connected to multimedia sources, e.g., a computer, a portable terminal, a set top box, and a digital versatile disk (DVD) player. The display apparatus transmits data to and receives data from the multimedia sources, and performs various multimedia functions such as reproduction of an image, a sound, or the like.

Various connector apparatuses have been used in order to physically connect the display apparatus and the multimedia sources. For example, connectors for wired interfaces such as a high definition multimedia interface (HDMI), a digital video/visual interface (DVI), a mobile high-definition link (MHL), and an optical terminal have been widely used.

The HDMI is one of uncompressed digital video/audio interface specifications. The DVI is a wired interface specification for digitizing a video image and transmitting and receiving the digitized video image. The MHL, which is an interface specification similar to that of the HDMI, is a high speed wired interface specification for connecting a mobile device and a TV to each other. The optical terminal may transmit a digital signal through light.

In addition to the connector wiring, separate power cables are also required in order to supply power to the display apparatus.

SUMMARY

Exemplary embodiments are provided to address the above disadvantages and other disadvantages not described above. Also, the present invention is not necessarily required to overcome the disadvantages described above, and an exemplary embodiment may not overcome any of the problems described above.

Exemplary embodiments provide a connector apparatus capable of simultaneously transferring power and signals, and a display apparatus including the same.

According to an aspect of an exemplary embodiment, a connector apparatus includes: a pair of connectors configured to be coupled to apparatuses; and a cable connecting the pair of connectors, wherein each connector of the pair of connectors includes a signal line part including a plurality of signal pins and a power line part including first and second terminals.

According to an aspect of another exemplary embodiment, a display apparatus includes: a body including a display; an external apparatus separated from the body; and a connector apparatus configured to transfer signals and power between the body and the external apparatus.

BRIEF DESCRIPTION OF THE DRAWINGS

The above and/or other aspects of the disclosure will be more apparent by describing certain exemplary embodiments with reference to the accompanying drawings, in which.

DETAILED DESCRIPTION OF EXEMPLARY EMBODIMENTS

Figure 1:
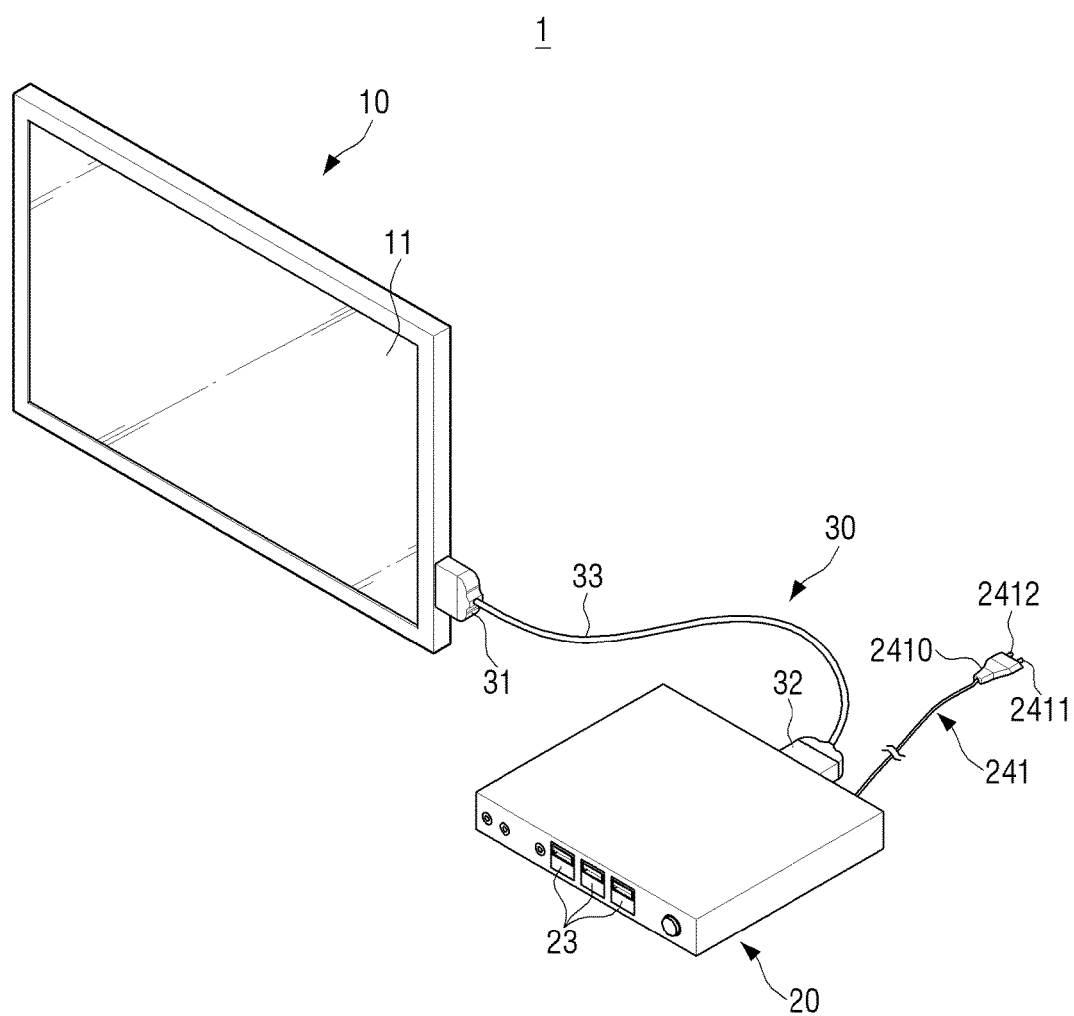
FIG. 1 is a view illustrating a configuration of a display apparatus according to an exemplary embodiment.

Hereinafter, exemplary embodiments of the present disclosure will be described in detail with reference to the accompanying drawings. Exemplary embodiments to be described below will be described on the basis of exemplary embodiments most appropriate for understanding technical features of the present disclosure, and these exemplary embodiments do not limit the technical features of the present disclosure, but exemplify that the present disclosure may be implemented like these exemplary embodiments.

Therefore, the present disclosure may be variously modified without departing from the technical scope of the present disclosure through exemplary embodiments to be described below, and these modifications will be to fall within the technical scope of the present disclosure. In addition, in order to assist in the understanding of exemplary embodiments to be described below, components performing the same operations and related components in the respective exemplary embodiments will be denoted by the same or similar reference numerals throughout the accompanying drawings.

Figure 2:
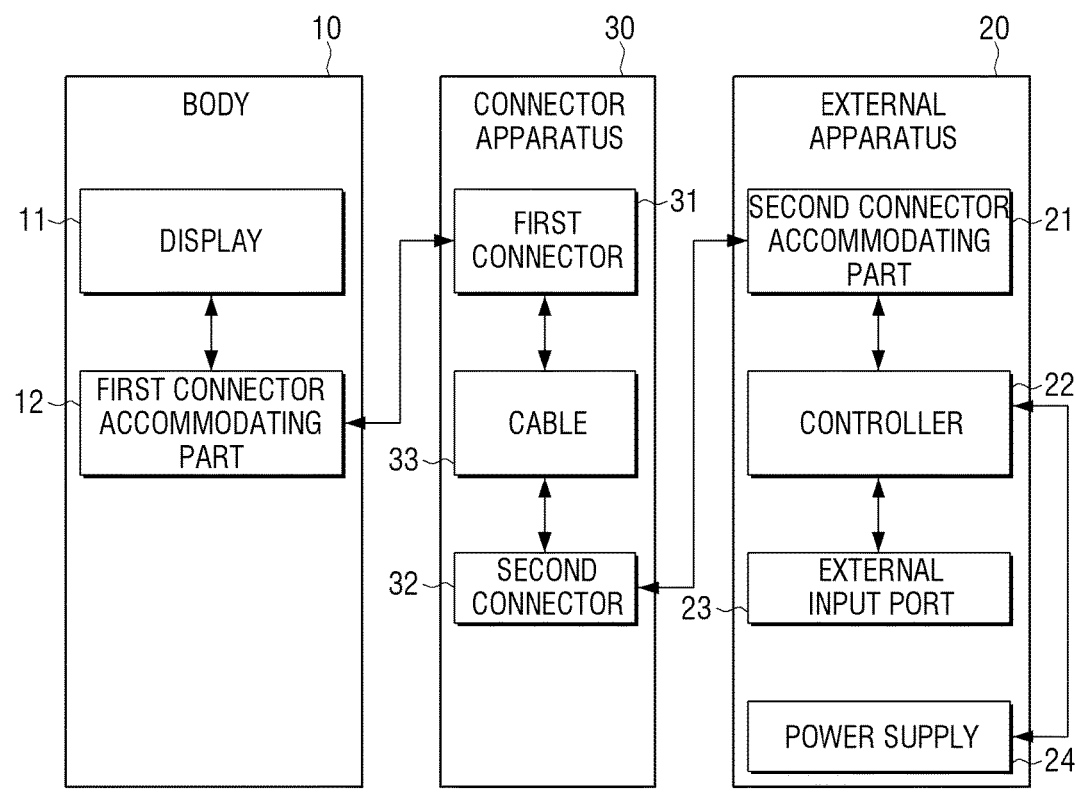
FIG. 2 is a block diagram schematically illustrating a control flow of the display apparatus according to an exemplary embodiment.

FIG. 1 is a view illustrating a configuration of a display apparatus 1 according to an exemplary embodiment, and FIG. 2 is a block diagram schematically illustrating a control flow of the display apparatus 1 illustrated in FIG. 1.

Referring to FIGS. 1 and 2, the display apparatus 1 may include a body 10, an external apparatus 20, and a connector apparatus 30 connecting the body 10 to the external apparatus 20.

The body 10 may display data transmitted from the external apparatus 20 as a content image through a display 11, and reproduce a content sound through a built-in speaker.

The display 11 may include panels which may be thin and lightened. Examples of such panels may include, but are not limited to, a liquid crystal display (LCD) panel, a light emitting diode (LED) panel, and an organic light emitting diode (OLED) panel.

The display 11 may include a touch screen, and a user may touch the touch screen of the display 11 to input an operation command of the display apparatus 1.

In addition, the body 10 may include a first connector accommodating part 12 formed for connection to the connector apparatus 30.

The first connector accommodating part 12 may have a shape corresponding to a shape of a first connector 31 of a connector apparatus 30 so that the first connector 31 may be connected to the first connector accommodating part 12. Connection between the body 10 and the connector apparatus 30 will be described below.

The external apparatus 20 may include a second connector accommodating part 21, a controller 22, an external input port 23, and a power supply 24.

The second connector accommodating part 21 may have a shape corresponding to a shape of a second connector 32 of the connector apparatus 30 so that the second connector 32 may be connected to the second connector accommodating part 21. In addition, configurations of the first connector 31 and the second connector 32 may be the same, and configurations of the first connector accommodating part 12 and the second connector accommodating part 21 may be the same. Therefore, the body 10 and the external apparatus 20 may be connected to each other by coupling any one of the first and second connectors 31 and 32 to the first connector accommodating part 12 and coupling the other of the first and second connectors 31 and 32 to the second connector accommodating part 21 without distinction between the first and second connectors 31 and 32 of the connector apparatus 30.

The second connector accommodating part 21 is connected to the controller 22, such that an operation command of the controller 22 may be transmitted to the body 10 through the connector apparatus 30, thereby enabling the controller 22 to control an operation of the body 10.

In addition, an operation command input through the touch screen, or the like, of the body 10 or operation information of the body 10 may be transmitted to the controller 22. Connection relationships between the connector apparatus 30 and the first and second connector accommodating parts 12 and 21 will be described in detail below.

The external apparatus 20 may include an external input port 23. The number and a type of the external input port 23 may vary according to exemplary embodiments. Therefore, multiple external input ports 23 of different kinds may be employed. For example, the external input port 23 may include a high definition multimedia interface (HDMI), a digital video/visual interface (DVI), a mobile high-definition link (MHL), an optical terminal, and the like.

A plurality of multimedia sources, such as a computer, a portable terminal, a set top box, and a digital versatile disk (DVD) player, may be physically connected to the external input port 23 through cables, and the like. The signals input from the multimedia sources may be transmitted to the body 10 through the controller 22, such that a content image or a content sound may be reproduced by the body 10.

The controller 22 may transmit signals input from the multimedia sources to the body 10 through the external input port 23. Also, the controller may transmit operation commands for controlling the multimedia sources to the multimedia sources to control contents to be reproduced by the body 10.

The controller 22 may control a general operation of the display apparatus 1, so the body 10 may need only a reduced number and/or size of components to operate the display 11 based on signals received from the controller 22. Therefore, the body 10 of the display apparatus 1 may be thinner than that of a display apparatus according to the related art.

The external input port 23 may include wireless transceivers and wirelessly transmit and receive signals to and from the multimedia sources through the wireless transceivers. For example, the wireless transceivers may be wirelessly connected to external multimedia sources using a wireless communication scheme, such as Bluetooth™, and the like.

In addition, although FIG. 1 shows a plurality of external input ports 23 disposed in a front surface of the external apparatus 20 by way of example, disposition of the external input port 23 is not limited thereto. For example, the external input port 23 may be disposed on a rear surface, a side surface, or the like, of the external apparatus 20 to improve an aesthetic sense of an appearance of the external apparatus 20.

The power supply 24 may supply power to the display apparatus 1 and include a power cable 241 for connection to an external power outlet. In addition, the power cable 241 may include a power plug 2410 including a pair of outlet terminals 2411 and 2412 that may be inserted into the power outlet.

The pair of outlet terminals 2411 and 2412 may include a first outlet terminal 2411 and a second outlet terminal 2412, the first outlet terminal 2411 may be connected to a live terminal of the power outlet, and the second outlet terminal 2412 may be connected to a neutral terminal of the power outlet.

In addition, the power supply 24 may include an inverter converting alternating current (AC) power transmitted from the power outlet generally used in a home into direct current (DC) power required for driving the body 10 and the external apparatus 20. The body 10 and the external apparatus 20 may be operated through the DC power converted in the power supply 24.

As aforementioned, the external apparatus 20 may be configured separately from the body 10 and include the controller 22, the external input ports 23, and the power supply 24, such that a thickness of the body 10 may be reduced compared with a display apparatus according to other display apparatuses that include such components, i.e., a display, a controller, external input ports, a power supply, and the like, in a body. Therefore, an aesthetic sense that a user may feel through the display apparatus 1 may also be improved.

Figure 3:
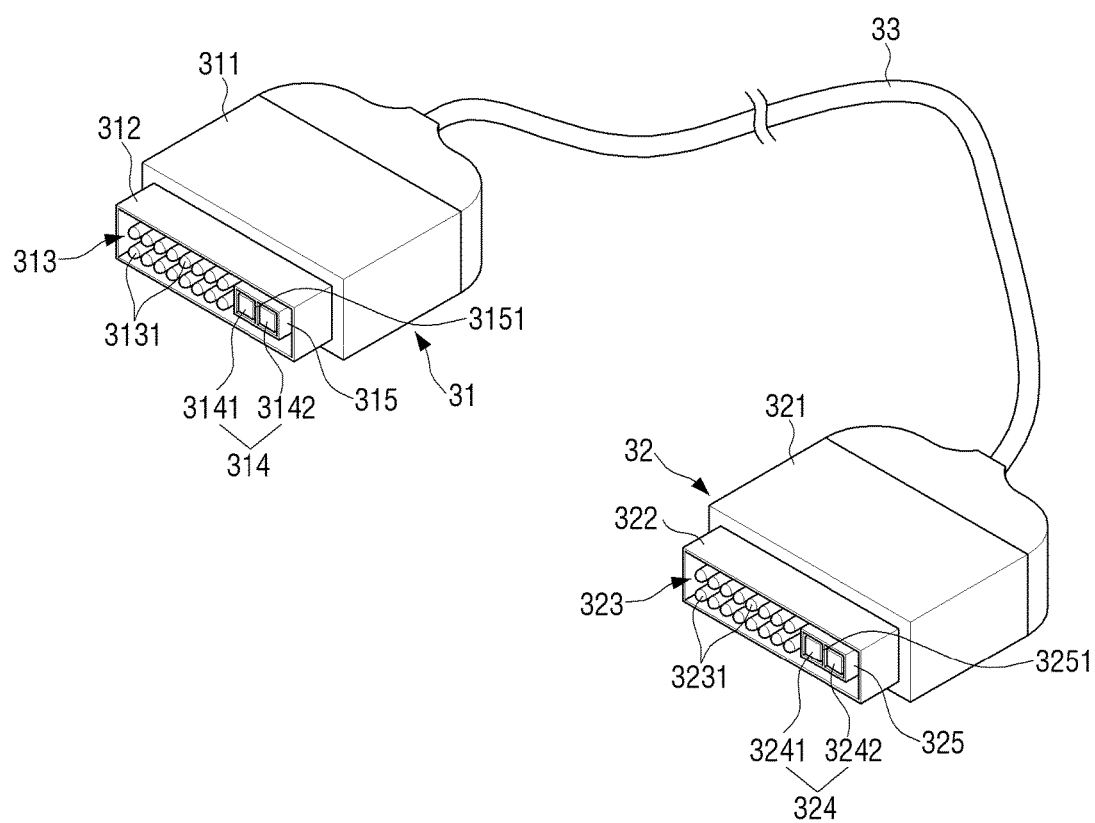
FIG. 3 is a perspective view illustrating a connector apparatus according to an exemplary embodiment.

FIG. 3 is a perspective view illustrating the connector apparatus 30 according to an exemplary embodiment.

Referring to FIG. 3, the connector apparatus 30 may include the first connector 31, the second connector 32, and a cable 33 connecting the first connector 31 with the second connector 32.

The first and second connectors 31 and 32 may include connector housings 311 and 321, fastening parts 312 and 322, signal line parts 313 and 323, power line parts 314 and 324, and isolating parts 315 and 325, respectively. Both ends of the cable 33 are connected to the respective circuit boards in the connector housings 311 and 321 of the first and second connectors 31 and 32, respectively. The signal line parts 313 and 323 and the power line parts 314 and 324 are mounted on the circuit boards, such that the first and second connectors 31 and 32 may transmit signals and power therebetween.

The connector housings 311 and 321 may form appearances of the first and second connectors 31 and 32, respectively, and the user may grab the connector housings 311 and 321. The connector housings 311 and 321 may be formed using an isolating material such as rubber or plastic.

The fastening parts 312 and 322 may protrude from the connector housings 311 and 321, respectively, and be inserted into and coupled to the first and second connector accommodating parts 12 and 21, respectively.

To this end, the first and second connector accommodating parts 12 and 21 may include accommodating grooves having shapes corresponding to those of the fastening parts 312 and 322 so that the fastening parts 312 and 322 are fitted into and coupled to the respective accommodating grooves of the first and second connector accommodating parts 12 and 21, respectively. As such, the body 10 and the external apparatus 20 may be interconnected by the connector apparatus 30.

In addition, the fastening parts 312 and 322 may have shapes of grooves formed inwardly of the connector housings 311 and 321. In this case, the first and second connector accommodating parts 12 and 21 may have shapes protruding outwardly from the body 10 and the external apparatus 20, respectively, such that the first and second connector accommodating parts 12 and 21 may be inserted into and coupled to the fastening parts 312 and 322, respectively.

In addition, as illustrated in FIG. 3, the fastening parts 312 and 322 may have wall structures enclosing the signal line parts 313 and 323 and the power line parts 314 and 324. The fastening parts 312 and 322 may be inserted into and coupled to the first and second connector accommodating parts 12 and 21 having shapes corresponding to those of the fastening parts 312 and 322, such that the signal line parts 313 and 323 and the power line parts 314 and 324 may be easily inserted in the respective holes of the first and second connector accommodating parts 12 and 21.

Figure 4:
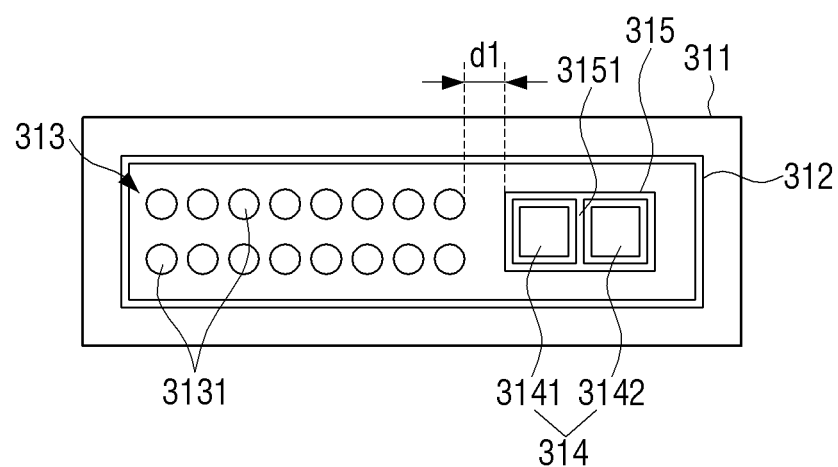
FIG. 4 is a front view of a first connector according to an exemplary embodiment.

FIG. 4 is a front view of a first connector 31 illustrated in FIG. 3.

Hereinafter, configurations of the signal line parts 313 and 323 and the power line parts 314 and 324 will be described in detail with reference to FIGS. 3 and 4. In an exemplary embodiment, the first and second connectors 31 and 32 may have the same configuration, such that any of the first and second connectors 31 and 32 may be coupled to any of the first connector accommodating part 12 and the second connector accommodating part 21. Therefore, configurations of the first and second connectors 31 and 32 will be described on the basis of the front view of the first connector 31 illustrated in FIGS. 3 and 4.

As illustrated in FIGS. 3 and 4, the signal line parts 313 and 323 may include a plurality of signal pins 3131 and 3231, respectively, and the signal line part 313 of the first connector 31 and the signal line part 323 of the second connector 32 may be interconnected by the cable 33.

The plurality of signal pins 3131 and 3231 may be inserted into the first connector accommodating part 12 and the second connector accommodating part 21, respectively, to transmit signals between the body 10 and the external apparatus 20.

To this end, the first connector accommodating part 12 and the second connector accommodating part 21 may include a plurality of signal pin holes into which the plurality of signal pins 3131 and 3231 may be inserted, respectively. The signal pin holes may be arranged to correspond to arrangements of the signal pins 3131 and 3231, such that the signal pins 3131 and 3231 may fit the signal pin holes.

The signal pins 3131 and 3231 may consist of, for example, a total of sixteen signal pins, respectively, as illustrated in FIGS. 3 and 4, and the sixteen signal pins may be sequentially a VBUS pin, a Data4 ground (GND) pin, a Data4−pin, a Data4+pin, a Data2 ground pin, a Data2−pin, a Data2+pin, a USB ground pin, a USB D−pin, a USB D+pin, a Data1 ground pin, a Data1−pin, a Data1+pin, an eCBUS#0 ground pin, an eCBUS#0/ID pin, and a VBUS ground pin.

The VBUS pin is a pin for transmitting and receiving a power signal to and from a connector socket, and the VBUS ground (GND) pin is a pin for transmitting and receiving a ground signal of VBUS.

The eCBUS/ID pin, which is a pin for transferring bidirectional signals, may simultaneously transfer a clock signal and a normal signal. In addition, the eCBUS/ID pin may be used to transmit and receive at least one of a control signal, a device identification signal, and a coupling direction decision signal.

The Data+ pin, the Data− pin, and the Data GND pin belong to a differential pair pin set for transmitting and receiving an AV data signal. The differential pair pin set transmits and receives AV data in a transition minimized differential signaling (TMDS) format. A TMDS transmits and receives an image, a voice, and additional data in an image data period, a data thumb period, and a control period. The TMDS transmits and receives pixel information of a moving picture line in the image data period, and transmits and receives additional information including voice information and a series of pieces in the data thumb period. The data thumb period occurs in a horizontal or vertical blanking period. The control period occurs between the image data period and the data thumb period.

The Data+ pin, the Data− Pin, and the Data GND pin may transmit and receive a total of six TMDSs from Data0 to Data5. Each differential signal pair may have a transmission and reception speed of 20 Gbps, and transmit and receive 8K-3D image data of maximum 240 Hz.

All of the Data+pin, the Date−pin, and the Data GND pin may transmit and receive bidirectional signals, and perform unidirectional data transmission and reception at the time of transmitting and receiving normal AV data.

The USB ground pin, the USB D−pin, and the USB D+pin are pin for transmitting and receiving data according to USB specifications. Therefore, USB data and AV data may be transmitted and received through one connector apparatus without separately including a USB connector.

As described above, the signal line parts 313 and 323 include the plurality of signal pins 3131 and 3231, thereby making it possible to transmit signals transferred through the plurality of multimedia sources between the body 10 and the external apparatus 20 by only a single connector apparatus 30.

As illustrated in FIGS. 3 and 4, the power line parts 314 and 324 may be disposed in the fastening parts 312 and 322, respectively, and be disposed adjacently to one sides of the signal line parts 313 and 323, respectively.

In addition, it is required to secure a preset isolation distance between the power line parts 314 and 324 and the signal line parts 313 and 323 in order to prevent a short-circuit. Also, such isolation distance may also prevent interference between the power line parts 314 and 324 and the signal line parts 313 and 323, which is generated due to discharge between the power line parts 314 and 324 and the signal line parts 313 and 323, or the like. The isolation distance may be divided into a clearance distance and a creepage distance, and the power line parts 314 and 324 and the signal line parts 313 and 323 need to have a sufficient clearance distance and a creepage distance depending on a rated voltage therebetween. Therefore, the power line parts 314 and 324 and the signal line parts 313 and 323 may be spaced a first distance d1 apart that is equal to or greater than a minimum isolation distance.

The power line parts 314 and 324 may include a pair of power terminals, respectively. The power terminals may be inserted into the first and second connector accommodating parts 12 and 21, respectively, thereby making it possible for the external apparatus 20 to supply power to the body 10.

In detail, the power line parts 314 and 324 may include first terminals 3141 and 3241 and second terminals 3142 and 3242, respectively. The first and second terminals 3141 and 3142 of the first connector 31 and the first and second terminals 3241 and 3242 of the second connector 32 may be connected to each other through the cable 33.

In addition, the first and second connector accommodating parts 12 and 21 may include a pair of power terminal holes into which the first terminals 3141 and 3241 and the second terminals 3142 and 3242 may be inserted, respectively. The pair of power terminal holes may be arranged to correspond to arrangements of the first terminals 3141 and 3241 and the second terminals 3142 and 3242, such that the first terminals 3141 and 3241 and the second terminals 3142 and 3242 may be easily inserted into the pair of power terminal holes.

Therefore, the first terminals 3141 and 3241 and the second terminals 3142 and 3242 are coupled to the respective power terminal holes of the first and second connector accommodating parts 12 and 21, thereby making it possible for the power supply 24 of the external apparatus 20 to supply power to the body 10.

For example, the first and second terminals 3141 and 3142 of the first connector 31 may be coupled to the power terminal holes of the first connector accommodating part 12, and the first and second terminals 3241 and 3242 of the second connector may be coupled to the power terminal holes of the second connector accommodating parts 21, such that the body 10 may be electrically connected to the first and second outlet terminals 2411 and 2412 of the power supply 24 through the connector apparatus 30. Therefore, the first terminals 3141 and 3241 and the second terminals 3142 and 3242 may be electrically connected to the live terminal and the neutral terminal of the power outlet, respectively. In this case, the body 10 may include an inverter that may convert AC power supplied through the first connector accommodating part 12 into DC power.

In addition, as described above, in the case in which the power supply 24 includes the inverter that may convert the AC power input from the power outlet into the DC power, power transmitted from the second connector accommodating part 21 of the external apparatus 20 to the body 10 through the connector apparatus 30 may be DC power converted from AC power. Therefore, the first terminals 3141 and 3241 and the second terminals 3142 and 3242 may consist of positive terminals and negative terminals for transmitting the DC power, respectively.

In addition, configurations of the first terminals 3141 and 3241 and the second terminals 3142 and 3242 may be variously modified depending on an electrical connection scheme between the power line parts 314 and 324 and the first and second connector accommodating parts 12 and 21.

As illustrated in FIGS. 3 and 4, the first and second connectors 31 and 32 may include the isolating parts 315 and 325 enclosing the first terminals 3141 and 3241 and the second terminals 3142 and 3242, respectively.

The isolating parts 315 and 325 may be formed of an isolating material such as plastic or rubber, and may have shapes of walls disposed inside the fastening parts 312 and 322. For example, as illustrated in FIGS. 3 and 4, the isolating parts 315 and 325 may have quadrangular wall structures.

Therefore, the isolating parts 315 and 325 may electrically isolate the power line parts 314 and 324 and the signal line parts 313 and 323 from each other, respectively. Therefore, interference between power transmitted through the power line parts 314 and 324 and signals transmitted through the signal line parts 313 and 323 may be prevented. Also, crosstalk caused in a process of transmitting the power and the signals may be prevented. Therefore, even though the power and signals are simultaneously transmitted between the body 10 and the external apparatus 20 through the single connector apparatus 30, the power or the signals may be stably transmitted without being damaged or lost.

In addition, the isolating parts 315 and 325 may protrude outwardly as compared with the first terminals 3141 and 3241 and the second terminals 3142 and 3242, thereby minimizing exposure of the first terminals 3141 and 3241 and the second terminals 3142 and 3242.

Further, the isolating parts 315 and 325 may include central walls 3151 and 3251 formed between the first terminals 3141 and 3241 and the second terminals 3142 and 3242, respectively.

The central walls 3151 and 3251 electrically isolate the first terminals 3141 and 3241 from the second terminals 3142 and 3242, thereby preventing a short-circuit between the first terminals 3141 and 3241 and the second terminals 3142 and 3242. Therefore, safety of the display apparatus 1 including the connector apparatus 30 may be improved, while a distance between the first terminals 3141 and 3241 and the second terminals 3142 and 3242 is minimized to achieve a compact configuration of the first and second connectors 31 and 32.

Figure 5:
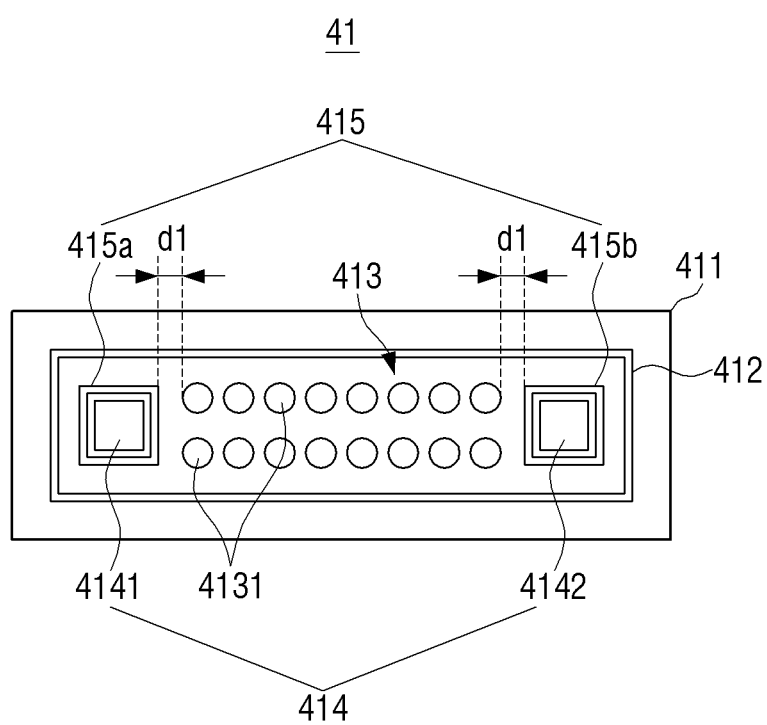
FIG. 5 is a front view illustrating a first connector according to another exemplary embodiment.

FIG. 5 is a front view illustrating a first connector according to another exemplary embodiment.

Referring to FIG. 5, a first connector 41 may include a connector housing 411, a fastening part 412, a signal line part 413, a power line part 414, and an isolating part 415.

Hereinafter, description of the first connector 41 will be focused on its elements having different functions than those of the first connector 31 illustrated in FIGS. 3 and 4, and description of elements of the first connector 41 that are similar to those of the first connector 31 will not be repeated.

As illustrated in FIG. 5, the power line part 414 of the first connector 41 may include a first terminal 4141 and a second terminal 4142, which are separated from each other by the signal line part 413.

The first connector 41 may include a first isolating part 415a enclosing the first terminal 4141, and a second isolating part 415b enclosing the second terminal 4142.

In addition, the first terminal 4141 may be spaced a first distance d1 apart from one side of the signal line part 413, which is equal to or greater than a minimum creepage distance. Likewise, the second terminal 4142 may be spaced the first distance d1 apart from the other side of the signal line part 413.

As described above, the first terminal 4141 and the second terminal 4142 are separated from each other by the signal line part 413. As a result, a short-circuit between the first terminal 4141 and the second terminal 4142 may be easily prevented.

The first connector 41 and the second connector 42 may have the same structure. Therefore, a user may connect the connector apparatus 30 to the body 10 and the external apparatus 20 easily without the need to distinguish between the first connector 41 and the second connector 42.

Figure 6:
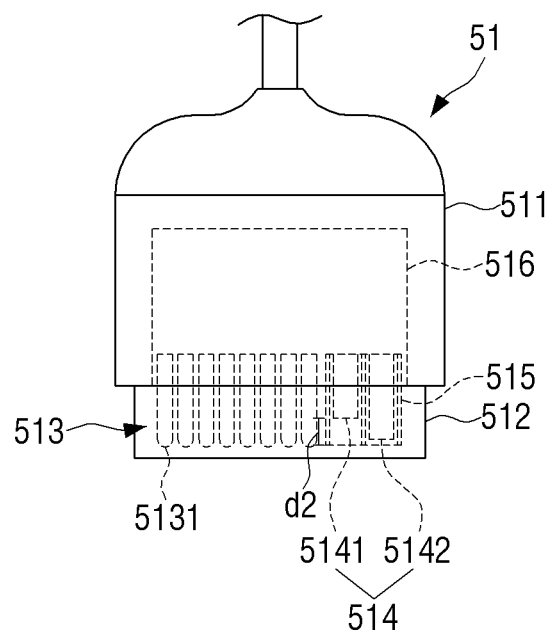
FIG. 6 is a plan view illustrating a first connector according to yet another exemplary embodiment.

FIG. 6 is a plan view illustrating a first connector according to yet another exemplary embodiment.

In FIG. 6, a signal line part 513, a power line part 514, an isolating part 515, and a circuit board 516 disposed in the first connector 51 are denoted by dotted lines.

Referring to FIG. 6, the first connector 51 may include a connector housing 511, a fastening part 512, the signal line part 513, the power line part 514, the isolating part 515, and the circuit board 516 on which the signal line part 513 and the power line part 514 are mounted.

The circuit board 516 may be connected to the cable 33, such that the first connector 51 and a second connector 52 may be connected to each other.

Hereinafter, description of the first connector 51 will be focused on its elements having different functions than those of the first connector 31 illustrated in FIGS. 3 and 4, and description of elements of the first connector 51 that are similar to those of the first connector 31 will not be repeated.

The first connector 51 and the second connector 52 may have the same structure. Therefore, a user may connect the connector apparatus 30 to the body 10 and the external apparatus 20 easily without the need to distinguish between the first connector 51 and the second connector 52.

As described above in reference to FIG. 1, the power plug 2410 may receive the AC power input from the power outlet. In an exemplary embodiment, the external apparatus 20 may include an inverter to convert the input AC power into the DC power, and power transferred from the power supply 24 to the body 10 through the connector apparatus 30 may be DC power. In this case, the power line part 514 of the first connector 51 may include a first terminal 5141 and a second terminal 5142. Here, the first terminal 5141 may be a positive terminal and the second terminal 5142 may be a negative terminal.

In addition, as illustrated in FIG. 6, the first terminal 5141 may be configured to be shorter than the second terminal 5142, such that a front end portion of the first terminal 5141 may be disposed at an inner side of the first connector 51 as compared with a front end portion of the second terminal 5142. The front end portion of the first terminal 5141 and the front end portion of the second terminal 5142 may be spaced a second distance d2 apart.

As a result, a damage to the circuit of the body 10 or the external apparatus 20, which is likely to occur due to an instantaneous potential difference when the connector apparatus 30 transmits the DC power, may be prevented because the second terminal 5142, i.e., a negative terminal, is electrically connected to the first connector accommodating part 12 (or the second connector accommodating part 21) before the first terminal 5141, i.e., the positive terminal, is electrically connected to the second connector accommodating part 21 (or the first connector accommodating part 12).

In addition, the first and second terminals 5141 and 5142 may be separated from each other by the signal line part 513 in the first connector 51, which is similar to the first connector 41 illustrated in FIG. 5. As aforementioned, the second terminal 5142, which is the negative terminal, may be configured to be longer than the first terminal 5141, which is the positive terminal.

The connector apparatus 30 according to an exemplary embodiment may include both the signal line parts 313 and 323 and the power line parts 314 and 324, to simultaneously transmit the signals and the power between the body 10 and the external apparatus 20 of the display apparatus 1. As a result, the connector apparatus 30 may simplify a structure of the display apparatus 1 because a separate power cable is no longer required.

Further, according to an exemplary embodiment, some of the components of the body 10 may be disposed in the external apparatus 20, and the body 10 and the external apparatus 20 are interconnected by a single connector apparatus 30. As a result, a thickness of the body 10 may be decreased, and the entire aesthetic sense of the display apparatus 1 is improved.

In addition, the signal line parts 313 and 323 and the power line parts 314 and 324 may be spaced a preset distance apart, and the isolating parts 315 and 325 may additionally isolate the signal line parts 313 and 323 and the power line parts 314 and 324 from each other. As a result, a short-circuit between the first terminals 3141 and 3241 and the second terminals 3142 and 3242 in the power line parts 314 and 324 may be prevented, and safety of the connector apparatus 30 may be secured.

In addition, when DC power is supplied from the external apparatus 20 to the body 10 through the connector apparatus 30, the negative terminal may be configured to be connected before the positive terminal is connected, thereby preventing the damage to the circuit due to the instantaneous potential difference.

Although various exemplary embodiments have been individually described hereinabove, the respective exemplary embodiments are not necessarily implemented singly, but may also be implemented so that configurations and operations thereof are combined with those of one or more other exemplary embodiments.

Although the exemplary embodiments have been illustrated and described hereinabove, the present disclosure is not limited to the specific exemplary embodiments described above, but may be variously modified by those skilled in the art to which the present disclosure pertains without departing from the scope and spirit of the disclosure as claimed in the claims. These modifications should also be understood to fall within the technical spirit and scope of the present disclosure.

What is claimed is:

1. A connector apparatus comprising: a pair of connectors configured to be coupled to apparatuses; and
a cable connecting the pair of connectors,
wherein each connector of the pair of connectors includes a signal line part including a plurality of signal pins, a power line part including first and second terminals, and an isolating part enclosing the power line part,
wherein the isolating part includes a central wall disposed between the first and second terminal,
wherein the second terminal is longer than the first terminal, and
wherein the first and second terminals are separated from each other by the central wall.

2. The connector apparatus as claimed in claim 1, wherein the power line part transfers direct current (DC) power, and the first terminal is a positive terminal and the second terminal is a negative terminal.

3. The connector apparatus as claimed in claim 1, wherein the isolating part includes first and second isolating parts enclosing the first and second terminals, respectively.

4. The connector apparatus as claimed in claim 1, wherein the signal line part and the power line part are spaced apart from each other by an isolation distance.

5. A display apparatus comprising:
a body including a display;
an external apparatus separated from the body; and
a connector apparatus configured to transfer signals and power between the body and the external apparatus, includes a pair of connectors and a cable connecting the pair of connectors, wherein the each connector of the pair of connectors includes a signal line part including a plurality of signal pins, a power line part including first and second terminals and, an isolating part enclosing the power line part, wherein the second terminal is longer than the first terminal, and wherein the first and second terminals are separated from each other by the signal line part.

6. The display apparatus as claimed in claim 5, wherein the power line part transfers direct current (DC) power, and the first terminal is a positive terminal and the second terminal is a negative terminal.

7. The display apparatus as claimed in claim 5, wherein the isolating part includes first and second isolating parts enclosing the first and second terminals, respectively.

8. The display apparatus as claimed in claim 5, wherein the signal line part and the power line part are spaced apart from each other by an isolation distance.

* * * * *